(12) United States Patent
Tsai et al.

(10) Patent No.: US 12,099,078 B2
(45) Date of Patent: Sep. 24, 2024

(54) PROBE CARD AND WAFER TESTING ASSEMBLY THEREOF

(71) Applicant: MPI Corporation, Hsinchu County (TW)

(72) Inventors: Yi-Chien Tsai, Hsinchu County (TW); Huo-Kang Hsu, Hsinchu County (TW); Yu-Wen Chou, Hsinchu County (TW); Yu-Shan Hu, Hsinchu County (TW)

(73) Assignee: MPI CORPORATION, Chu-Pei (TW)

( * ) Notice: Subject to any disclaimer, the term of this patent is extended or adjusted under 35 U.S.C. 154(b) by 12 days.

(21) Appl. No.: 17/856,678

(22) Filed: Jul. 1, 2022

(65) Prior Publication Data

US 2023/0065896 A1 Mar. 2, 2023

(30) Foreign Application Priority Data

Aug. 31, 2021 (TW) .................................. 110132362

(51) Int. Cl.
*G01R 1/073* (2006.01)

(52) U.S. Cl.
CPC ..... *G01R 1/07378* (2013.01); *G01R 1/07342* (2013.01)

(58) Field of Classification Search
CPC ........................ G01R 1/07378; G01R 1/07342
See application file for complete search history.

(56) References Cited

U.S. PATENT DOCUMENTS

| | | | | |
|---|---|---|---|---|
| 2002/0190738 A1* | 12/2002 | Beaman | ............. | G01R 1/07342 324/756.03 |
| 2005/0156613 A1* | 7/2005 | Hosaka | ............. | G01R 1/07342 324/756.03 |
| 2007/0240305 A1* | 10/2007 | Lee | ........................... | G01R 3/00 29/844 |
| 2011/0101523 A1* | 5/2011 | Hwang | .................... | H01L 24/16 257/737 |
| 2013/0033283 A1* | 2/2013 | Wu | ...................... | G01R 1/07342 324/756.03 |
| 2014/0077833 A1* | 3/2014 | Lee | ....................... | G01R 1/0491 29/830 |
| 2018/0074118 A1* | 3/2018 | Worrall | ................. | H01L 23/345 |
| 2021/0151382 A1* | 5/2021 | Hu | ....................... | H01L 21/6835 |

FOREIGN PATENT DOCUMENTS

TW 202121943 A 6/2021

* cited by examiner

*Primary Examiner* — Paresh Patel
(74) *Attorney, Agent, or Firm* — Birch, Stewart, Kolasch & Birch, LLP

(57) ABSTRACT

A probe card and a wafer testing assembly thereof are provided. The wafer testing assembly includes a printed circuit board, a space transformer, a plurality of copper pillars and a plurality of strengthening structure units. The printed circuit board includes a bottom surface and a plurality of first contacts arranged on the bottom surface. The space transformer includes a top surface and a plurality of second contacts. The second contacts are arranged on the top surface and corresponding to the first contacts. The copper pillars are respectively arranged between the first contacts and the second contacts. Two ends of each of the copper pillars are respectively electrically connected to the first contacts and the second contacts. The strengthening structure units are arranged on the bottom surface of the printed circuit board and respectively surrounding the copper pillars.

19 Claims, 9 Drawing Sheets

PROBE CARD AND WAFER TESTING ASSEMBLY THEREOF

CROSS-REFERENCE TO RELATED APPLICATION

This non-provisional application claims priority under 35 U.S.C. § 119(a) to Patent Application No. 110132362 filed in Taiwan, R.O.C. on Aug. 31, 2021, the entire contents of which are hereby incorporated by reference.

BACKGROUND

Technical Field

The disclosure relates to a probe card and a wafer testing assembly thereof

Related Art

Wafer testing is a step in the semiconductor manufacturing process, where probing is one of many semiconductor testing methods, and is used for testing a plurality of dies on a wafer. One of the probing methods is performed by using a probe card. The probe card may usually be divided into three parts: a printed circuit board (PCB), a space transformer, and a probe head. The printed circuit board is generally electrically connected to the space transformer by reflow soldering.

In a process of probing the dies on the wafer, a probe of the probe head directly touches a signal input and output port (such as a bonding pad or a bump) of a to-be-tested semiconductor element, and the printed circuit board is electrically connected to a test machine. A test signal is inputted to the to-be-tested semiconductor element through the printed circuit board, the space transformer and the probe by the test machine, and then a test result signal of the to-be-tested semiconductor element is returned to the test machine through the probe, the space transformer and the printed circuit board. In this way, whether the to-be-tested semiconductor element normally operates and whether the performance meets the standard are evaluated. During the test process, due to problems such as a material of the space transformer itself (for example, using a multilayer organic (MLO)), a thickness of the space transformer, and the number of the probes in the probe head, the space transformer may be flexible. Therefore, when the probe of the probe head applies a pressure on the bonding pad of the to-be-tested semiconductor element, the space transformer may be distorted and deformed. Further, a portion of the space transformer subjected to the pressure of the probe is deformed toward the printed circuit board. When the probe of the probe head leaves the bonding pad of the to-be-tested semiconductor element, the space transformer restores to its original shape. Therefore, after the probe card is repeatedly tested for a plurality of times, some contacts between the space transformer and the probe card may suffer fatigue failure or even direct fracture.

SUMMARY

In view of this, the disclosure provides a wafer testing assembly, including: a printed circuit board, a space transformer, a plurality of copper pillars and a plurality of strengthening structure units. The printed circuit board includes a top surface, a bottom surface, and a plurality of first contacts arranged on the bottom surface. The space transformer includes a top surface, a bottom surface, and a plurality of second contacts. The second contacts are arranged on the top surface and corresponding to the first contacts of the printed circuit board. The copper pillars are respectively arranged between the first contacts and the second contacts. Two ends of each of the copper pillars are respectively electrically connected to the first contacts and the second contacts. The strengthening structure units are arranged on the bottom surface of the printed circuit board and respectively surrounding the copper pillars.

The disclosure further provides a probe card. In addition to the wafer testing assembly, the probe card further includes a metal reinforcing member and a probe head. The metal reinforcing member is arranged on the top surface of the printed circuit board, and the probe head is arranged on the bottom surface of the space transformer.

According to the disclosure, the strengthening structure units are arranged around the copper pillars. When a probe of the probe head applies a pressure on a bonding pad of a to-be-tested semiconductor element, the strengthening structure units are supported between the top surface of the space transformer and the bottom surface of the printed circuit board. Therefore, the disclosure can avoid serious distortion and deformation of the space transformer, thereby resolving the problem of fatigue failure or fracture of contacts between the space transformer and the probe card after the probe card undergoes a plurality of wafer testing processes.

DETAILED DESCRIPTION

Figure 1:
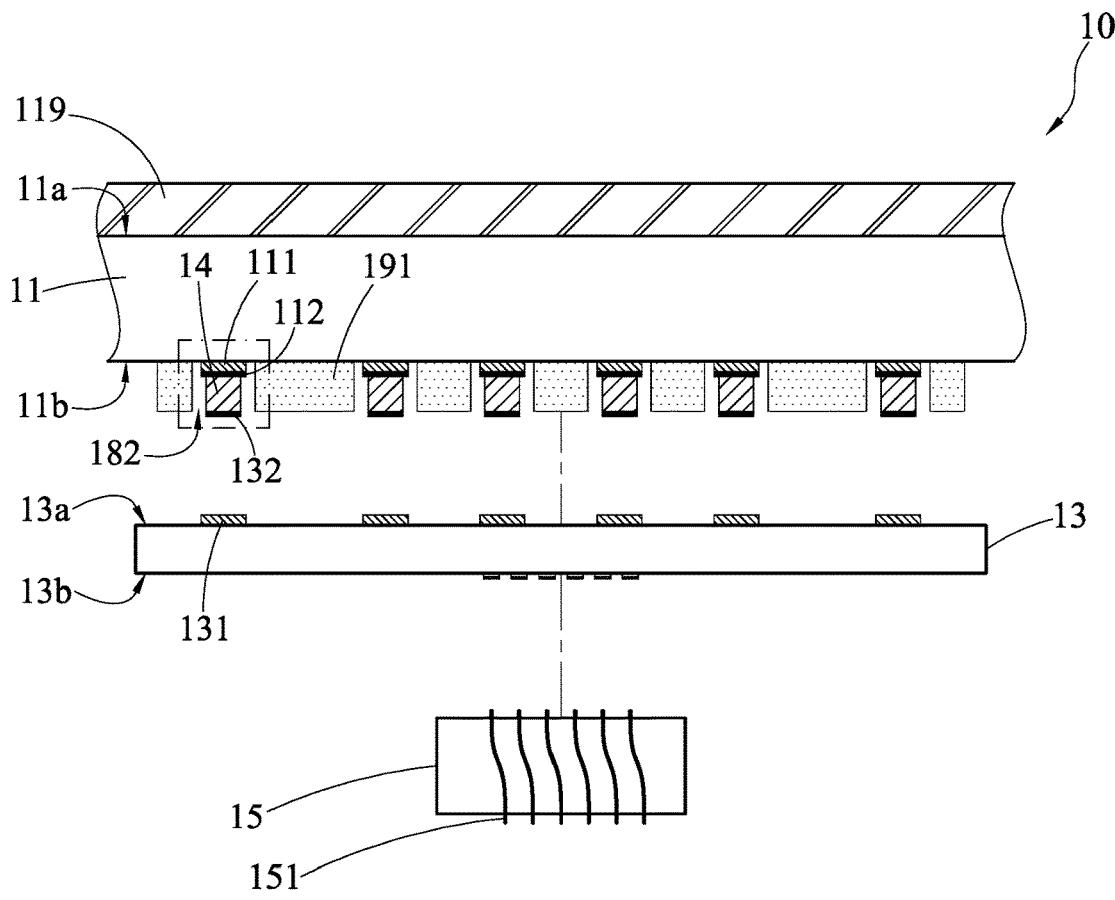
FIG. 1 is a schematic diagram (1) of a first embodiment according to the disclosure.
Figure 2:
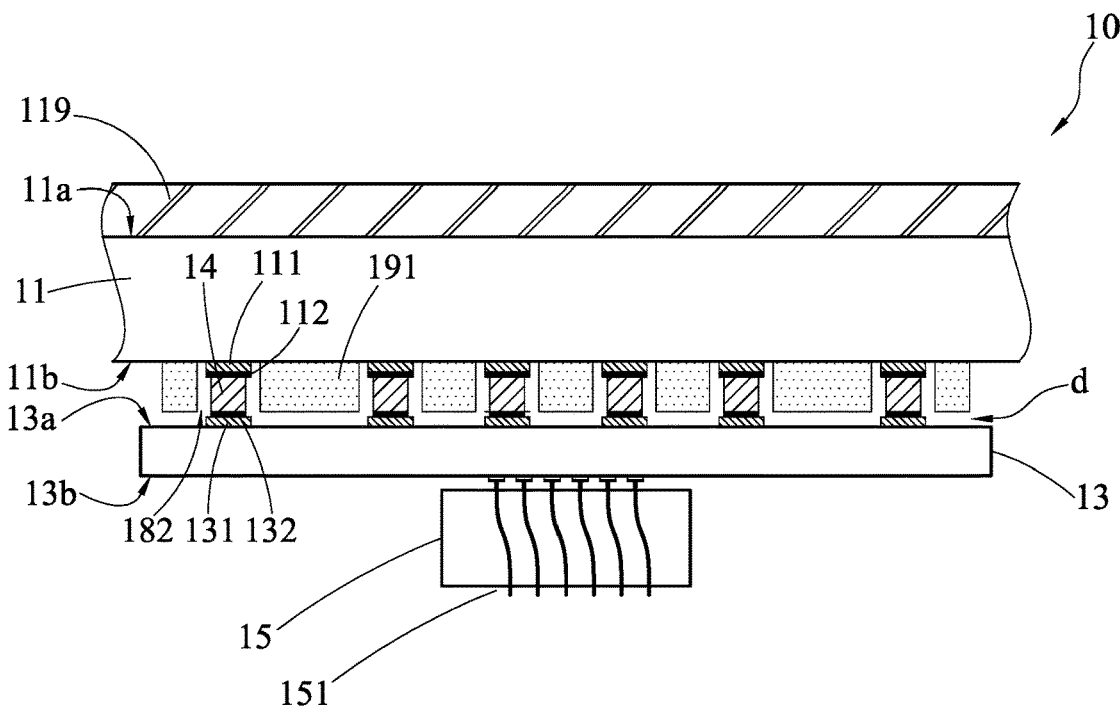
FIG. 2 is a schematic diagram (2) of a first embodiment according to the disclosure.
Figure 3:
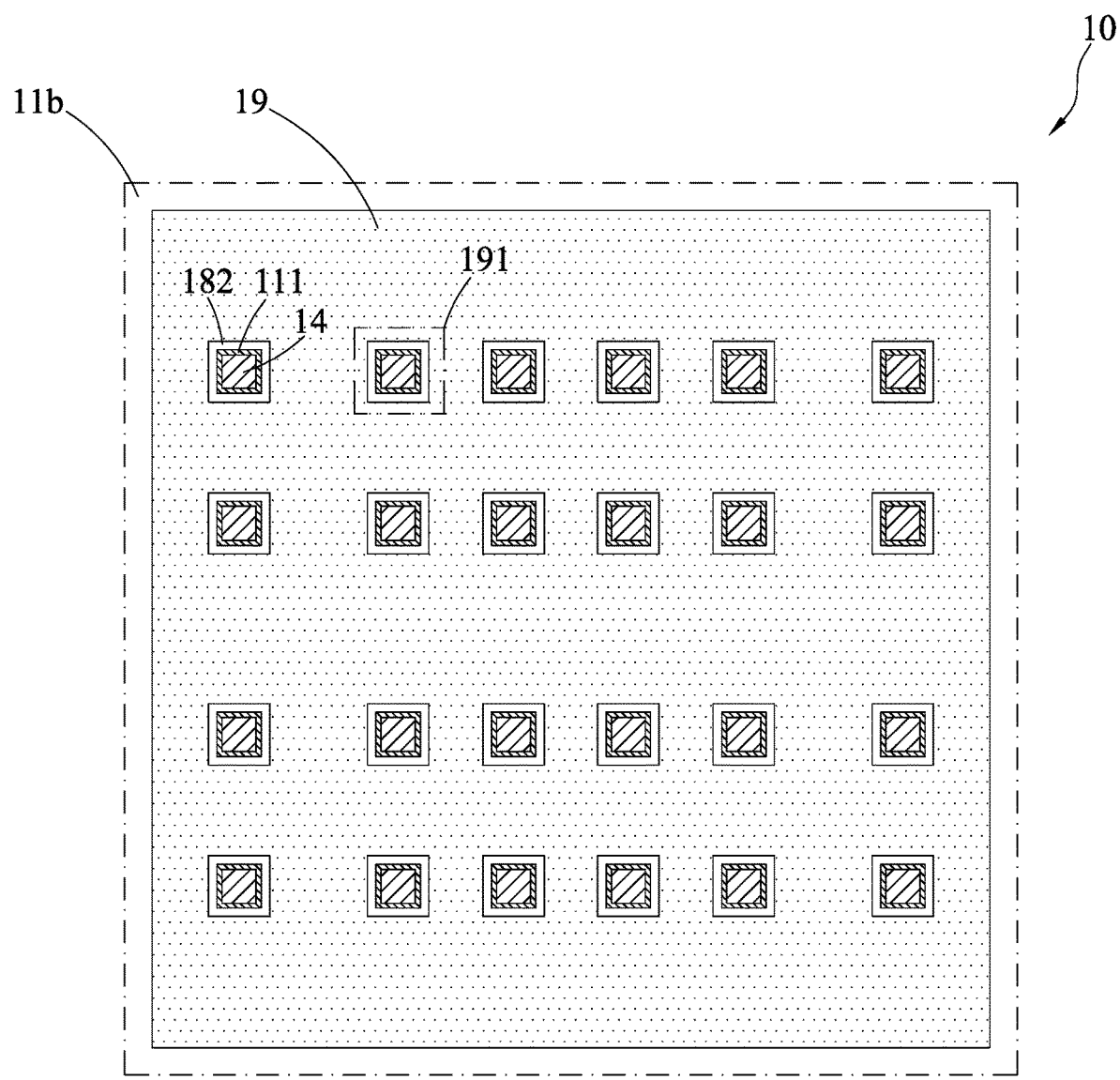
FIG. 3 is a partial bottom view (1) of a bottom surface of a printed circuit board of a first embodiment according to the disclosure, which illustrates the strengthening structure units jointly form a single strengthening structure layer.

FIG. 1, FIG. 2 and FIG. 3 are respectively a schematic diagram (1), a schematic diagram (2), and a partial bottom view (1) of a bottom surface of a printed circuit board of a first embodiment according to the disclosure, where a probe card 10 is depicted. The probe card 10 mainly includes a printed circuit board 11, a space transformer 13, and a probe head 15. For convenience of highlighting technical features of the disclosure in the drawings, each element of the probe card 10 is not drawn according to an actual scale, which applies to drawings of other embodiments. In an actual case, a width of the printed circuit board 11 is much greater than that of the space transformer 13. In addition, a thickness of the printed circuit board 11 is also greater than that of the space transformer 13. For example, the thickness of the printed circuit board 11 may be but not limited to 6 mm, and the thickness of the space transformer 13 may be but not limited to 2 mm. In addition, the word "above" or "below" used in the description is only used for describing an orientation of each element in the drawings to facilitate understanding, and is not used for limiting the disclosure.

The probe card 10 mainly includes the printed circuit board 11, the space transformer 13, and the probe head 15. During a process of performing wafer testing, a probe 151 of the probe head 15 is used for being in contact with a bonding pad of a die on a wafer, to transmit a test signal sent by a test machine to a to-be-tested die, and to return a test result generated by the to-be-tested die to the test machine for analysis.

The printed circuit board 11 includes a top surface 11a and a bottom surface 11b, the top surface 11a is used for being electrically connected to the test machine, and the bottom surface 11b is used for being electrically connected to the to-be-tested die. A metal reinforcing member 119, commonly known as an aluminum frame in the industry, is usually further arranged on the top surface 11a of the printed circuit board 11, is configured to reinforce a flex resistance of the printed circuit board 11, and is usually made of an aluminum alloy. A plurality of contacts (not shown in the figure) are arranged on the top surface 11a of the printed circuit board 11. The contacts of the top surface 11a are arranged in a region without the metal reinforcing member 119, to be electrically connected to the test machine, and to place an electronic component, or the like. A plurality of first contacts 111 are arranged on the bottom surface 11b of the printed circuit board 11, and materials of the first contacts 111 may be copper, or a nickel layer and a gold layer are further sequentially plated on a surface of the copper.

The space transformer 13 is arranged below the printed circuit board 11, and includes a top surface 13a and a bottom surface 13b, where a plurality of second contacts 131 are arranged on the top surface 13a. The second contacts 131 of the space transformer 13 are respectively corresponding to the first contacts 111 of the printed circuit board 11, and the corresponding first contacts 111 and second contacts 131 are electrically connected through the copper pillars 14. In some embodiments, a first solder 112 and a second solder 132 are respectively arranged on surfaces of the first contact 111 and the second contact 131, and two ends of the copper pillar 14 are respectively electrically connected to the first contact 111 and the second contact 131 by using the first solder 112 and the second solder 132. In addition, a plurality of strengthening structure units 191 as shown in FIG. 3 are arranged on the bottom surface 11b of the printed circuit board 11. The strengthening structure units 191 respectively surround the copper pillars 14 without being in contact with side surfaces of the copper pillars 14, and define an exhaust slot 182 with the side surfaces of the copper pillars 14.

A structure of the printed circuit board 11 usually includes a copper foil layer and a reinforcing layer. A common material of the reinforcing layer is a fiberglass composite, and one of structures of the space transformer 13 is stacked by multilayer organic (MLO) materials. Therefore, the strength of the space transformer 13 is much lower than that of the printed circuit board 11. For a plate, a deflection formula is $$H = \frac{FL^3}{4YBt^3},$$

where H is a deflection, F is a force, Y is a Young's modulus, L is a length of a fulcrum, B is a width of a test piece, and t is a thickness of the test piece. According to the deflection formula, because the Young's modulus of the space transformer 13 is much smaller than that of the printed circuit board 11, the deflection of the space transformer 13 is greater than that of the printed circuit board 11 under the same test conditions, that is, a deformation amount of the space transformer 13 is greater than that of the printed circuit board 11 under the same force conditions. Especially in an actual product, the thickness of the space transformer 13 itself is only about one third of that of the printed circuit board 11. Therefore, the space transformer 13 itself is quite easy to deform during the wafer testing process. By arranging the strengthening structure unit 191, the deformation amount of the space transformer 13 during the wafer testing process can be greatly reduced.

Referring to FIG. 3, in some embodiments, the strengthening structure units 191 are not individuals separated from each other, but jointly form a single strengthening structure layer 19 on the bottom surface 11b of the printed circuit board 11. In addition, in some embodiments, an end face of the copper pillar 14 facing the top surface 13a of the space transformer 13 is coplanar with a surface of the strengthening structure layer 19. It should be noted herein that, because the space transformer 13 itself is flexible, and a length of the copper pillar 14 has a process tolerance, the coplanar herein means that a height difference between the end face of the copper pillar 14 and the surface of the strengthening structure layer 19 falls within a process tolerance range.

Figure 4:
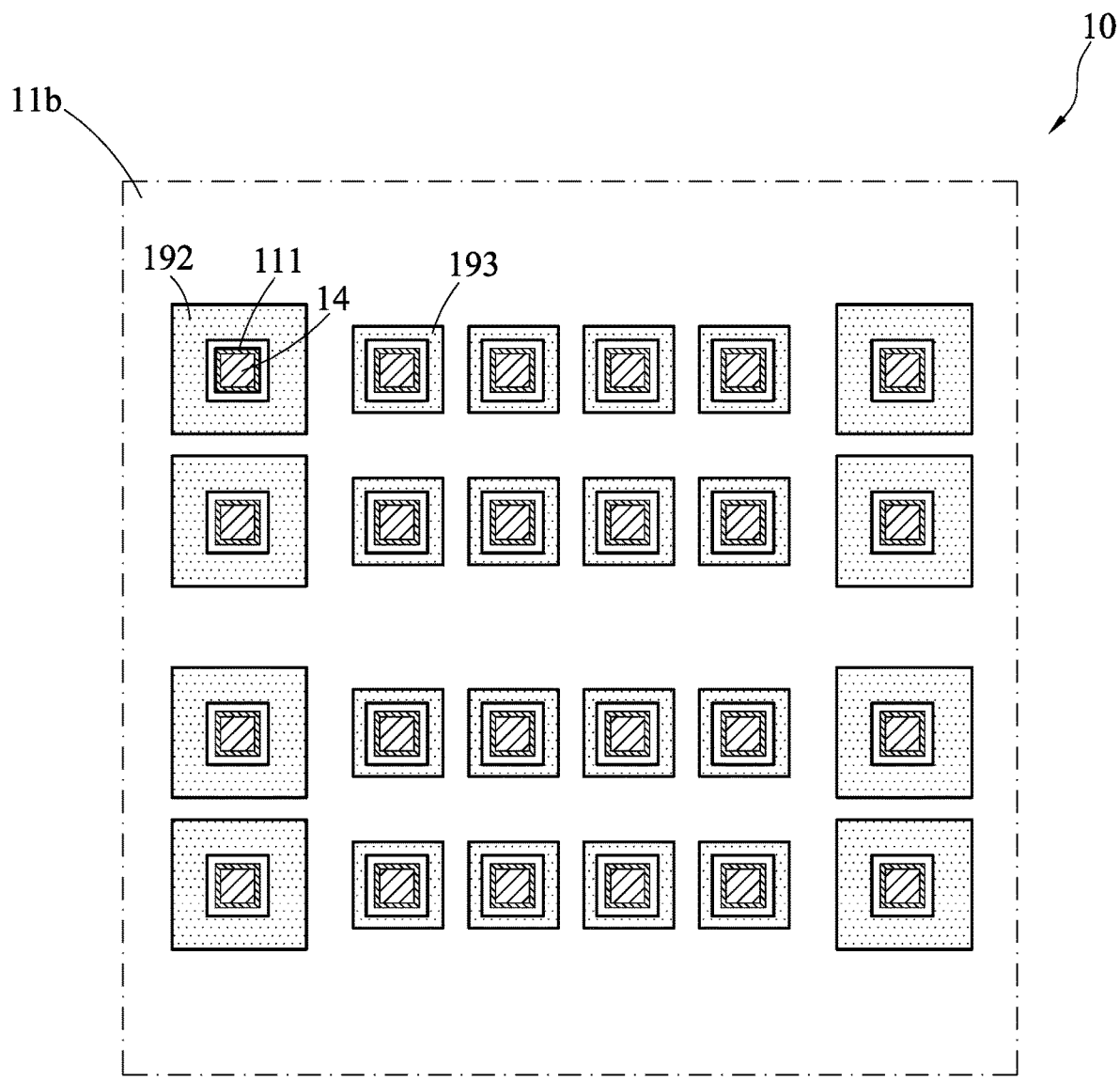
FIG. 4 is a partial bottom view (2) of a bottom surface of a printed circuit board of a first embodiment according to the disclosure, which illustrates a plurality of strengthening structure units and another plurality of strengthening structure units are separated from each other, and each of the strengthening structure units respectively surrounds the corresponding copper pillars.

Referring to FIG. 4, in some embodiments, a plurality of strengthening structure units 192 and a plurality of strengthening structure units 193 are separated from each other, and respectively surround the corresponding copper pillars 14. In some embodiments, the end face of the copper pillar 14 facing the top surface 13a of the space transformer 13 is coplanar with surfaces of the strengthening structure unit 192 and the strengthening structure unit 193. The coplanar herein means that a height difference between the end face of the copper pillar 14 and the surfaces of the strengthening structure unit 192 and the strengthening structure unit 193 falls within a process tolerance range. In addition, a size of the strengthening structure unit 192 is not the same as that of the reinforcement structure unit 193, but the strengthening structure unit 192 has a different size according to a required degree of reinforcement. In principle, the larger the sizes of the strengthening structure unit 192 and the strengthening structure unit 193 are, the more the deformation amount of the space transformer 13 during the wafer testing process can be reduced.

Figure 5:
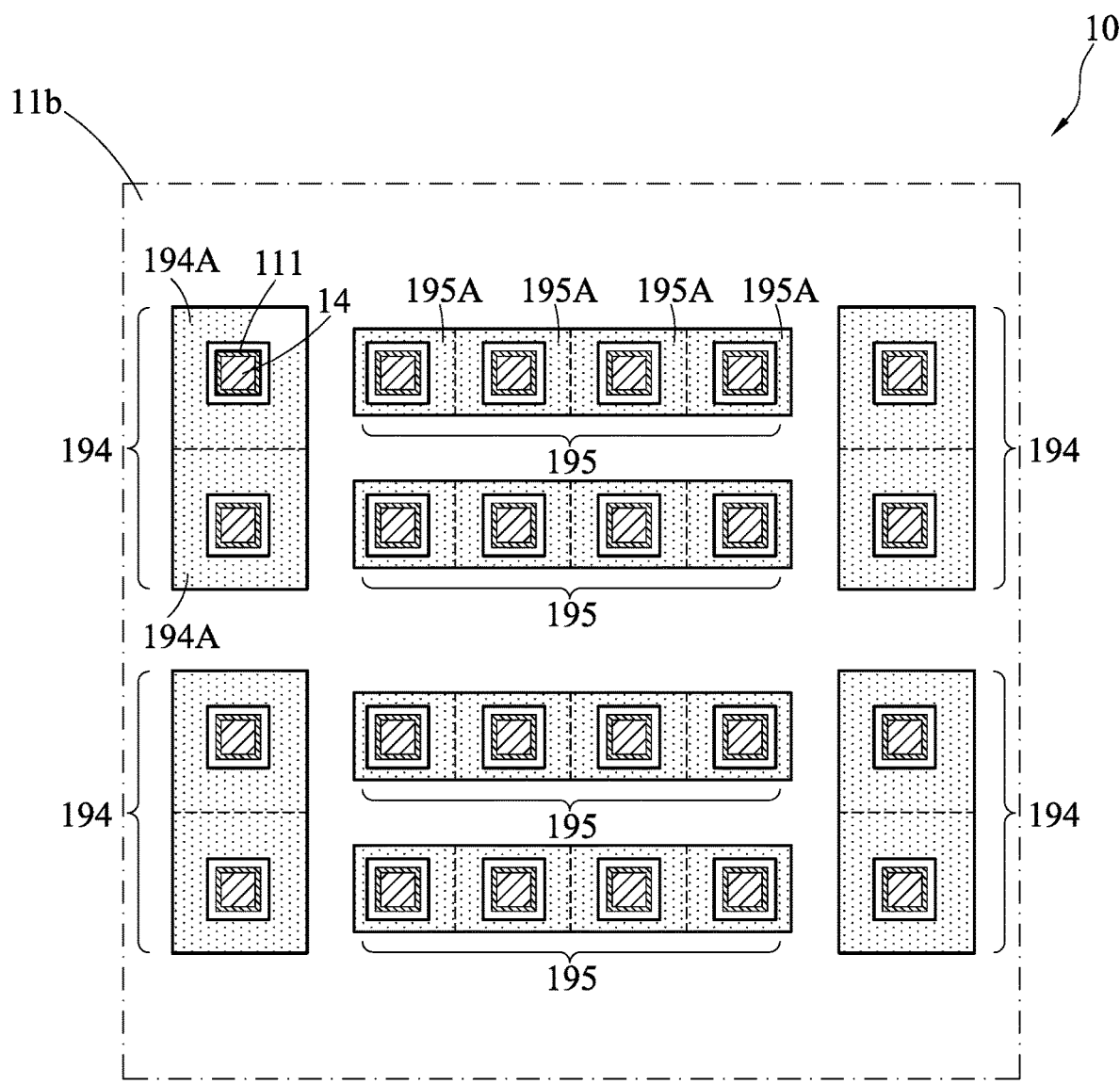
FIG. 5 is a partial bottom view (3) of a bottom surface of a printed circuit board of a first embodiment according to the disclosure, which illustrates two strengthening structure units are connected to each other to form a strengthening structure block while other four strengthening structure units are connected to each other to form another strengthening structure block.

Referring to FIG. 5, in some embodiments, two strengthening structure units 194A are connected to each other to form a strengthening structure block 194. However, the strengthening structure block 194 is not limited to including only two strengthening structure units 194A, and may also include more than two strengthening structure units 194A depending on the layout of the first contacts 111 and the required degree of reinforcement. In addition, four strengthening structure units 195A are also connected to each other to form a strengthening structure block 195. Likewise, the strengthening structure block 195 is not limited to including four strengthening structure units 195A, and may also include two, three, or more than four strengthening structure units 194A depending on the layout of the first contacts 111 and the required degree of reinforcement. In some embodiments, the end face of the copper pillar 14 facing the top surface 13a of the space transformer 13 is coplanar with surfaces of the strengthening structure block 194 and the strengthening structure block 195. The coplanar herein means that a height difference between the end face of the copper pillar 14 and the surfaces of the strengthening structure block 194 and the strengthening structure block 195 falls within a process tolerance range. It should be noted herein that, dotted lines in FIG. 5 are only used for distinguishing two adjacent strengthening structure units 194A or two adjacent strengthening structure units 195A, to facilitate explaining the invention concept of the disclosure, and do not represent that a physical interface exists between the two adjacent strengthening structure units 194A or the two adjacent strengthening structure units 195A.

Referring to FIG. 2 and FIG. 3, in some embodiments, there is a gap d between an end face of each strengthening structure unit 191 and the top surface 13a of the space transformer 13. In addition, the strengthening structure units 191 respectively surround the copper pillars 14 without being in contact with side surfaces of the copper pillars 14, and define an exhaust slot 182 around each of the copper pillars 14. Because the first solder 112 and the second solder 132 are formed on the surfaces of the first contact 111 and the second contact 131 by solder paste printing, and a solder paste itself contains a large amount of flux, gas is generated during a reflow soldering process. The existence of the gap d and the exhaust slot 182 can serve as a channel for the gas to overflow to the outside during the reflow soldering process. In some embodiments, a size of the gap d is less than or equal to 20 microns, for example, the size of the gap d may be 20 microns, 15 microns or 10 microns. The gap d should not be excessively large. If the size of the gap d exceeds much more than 20 microns, for example, if the size of the gap d is 30 microns, the deformation amount of the space transformer 13 caused by the probe card 10 during the wafer testing process is large, which is not helpful to resolve the problem of fatigue failure or fracture between the copper pillar 14 and the first contacts 111 or the second contacts 131.

Figure 6:
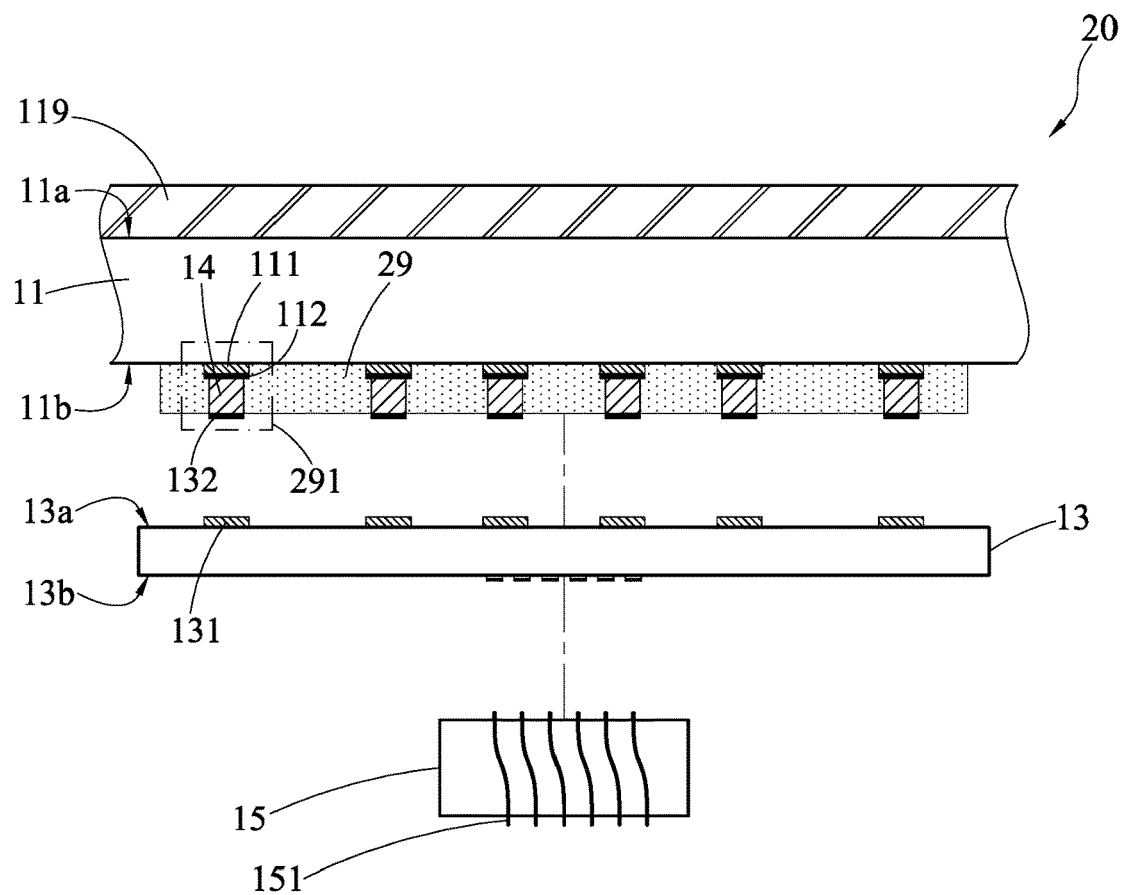
FIG. 6 is a schematic diagram (1) of a second embodiment according to the disclosure.
Figure 7:
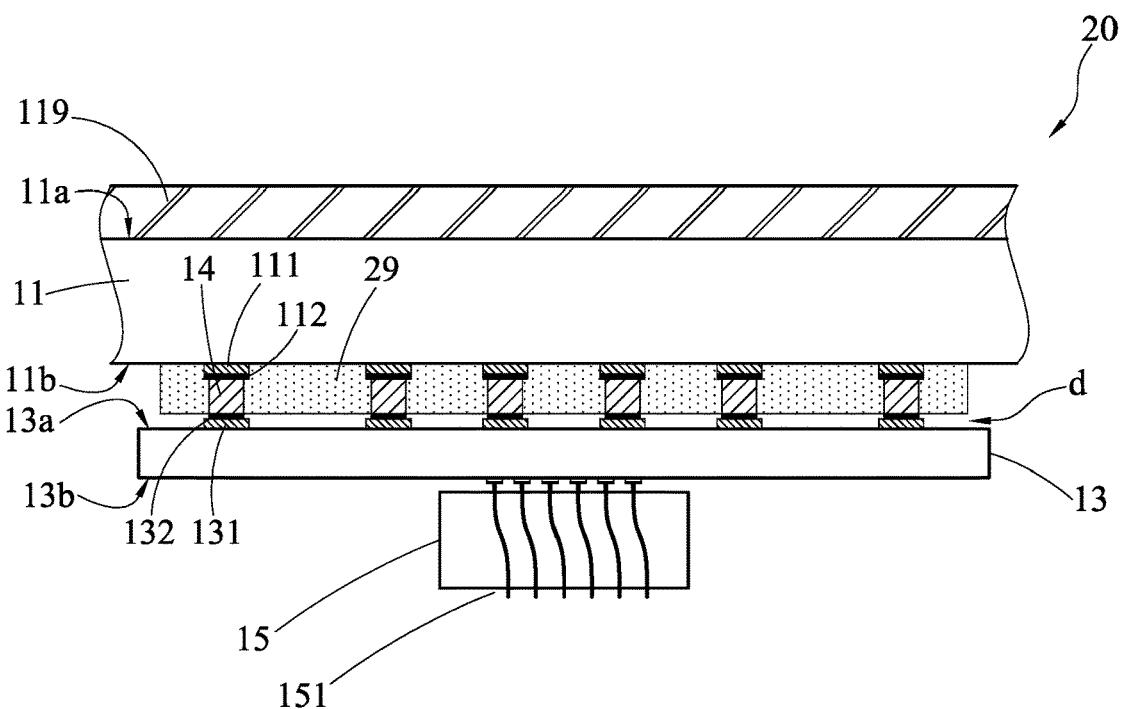
FIG. 7 is a schematic diagram (2) of a second embodiment according to the disclosure.
Figure 8:
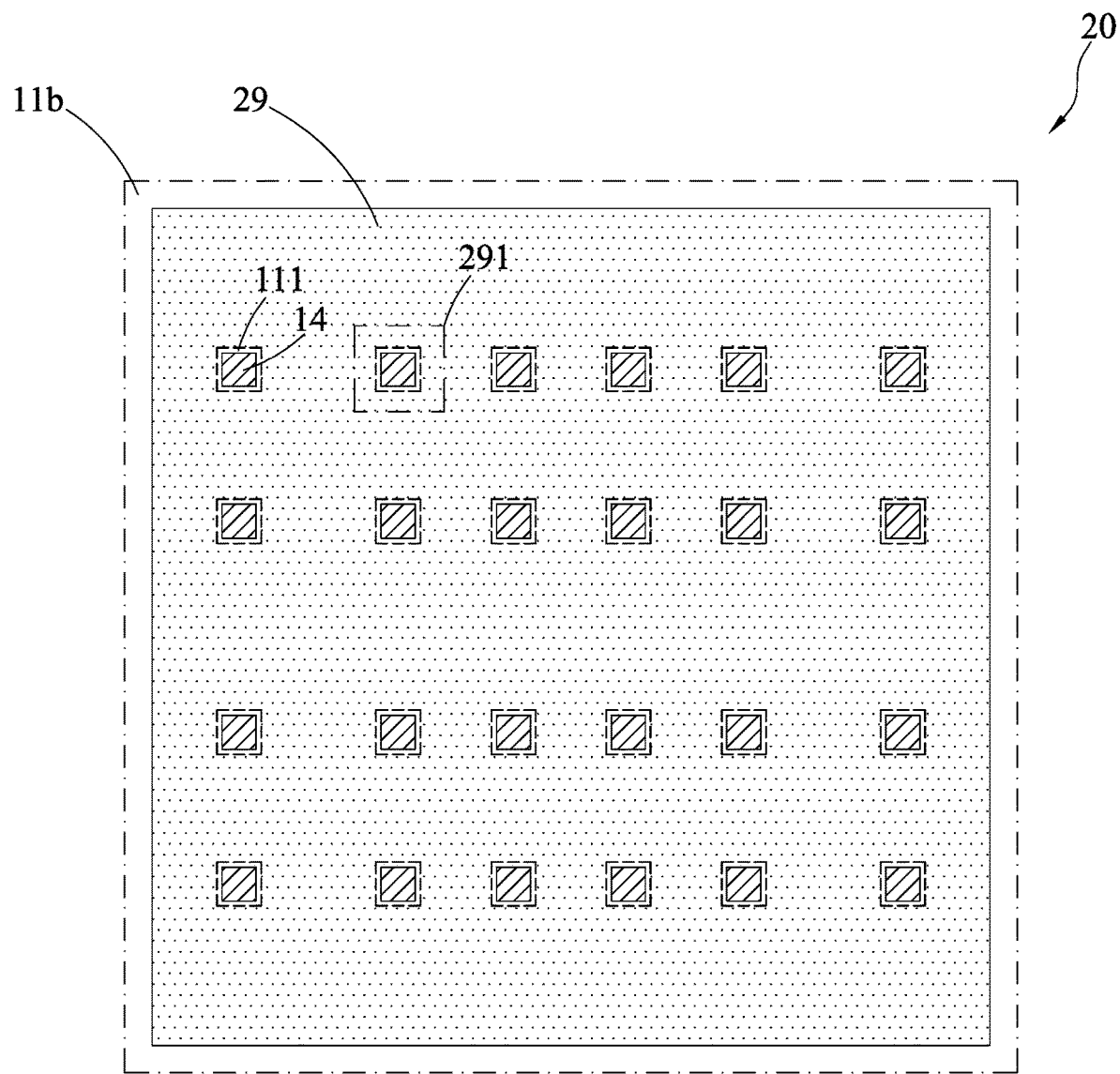
FIG. 8 is a partial bottom view of a bottom surface of a printed circuit board of a second embodiment according to the disclosure.

FIG. 6, FIG. 7 and FIG. 8 are respectively a schematic diagram (1), a schematic diagram (2), and a partial bottom view of a bottom surface of a printed circuit board of a second embodiment according to the disclosure, where a probe card 20 is depicted. In this embodiment, the strengthening structure units 291 jointly form a single strengthening structure layer 29 on the bottom surface 11b of the printed circuit board 11, and the strengthening structure units 291 respectively surround the copper pillars 14 and are in direct contact with the side surfaces of the copper pillars 14. Therefore, in this embodiment, no exhaust slot 182 is formed around each copper pillar 14 as in the first embodiment. Because the copper pillar 14 can be first soldered to the first contact 111 before the strengthening structure unit 291 is formed, the reflow soldering of the first contact 111 occurs before the strengthening structure unit 291 is formed. Therefore, during reflow soldering of the copper pillar 14 and the second contact 131 subsequently, the first contact 111 no longer generates gas.

Figure 9:
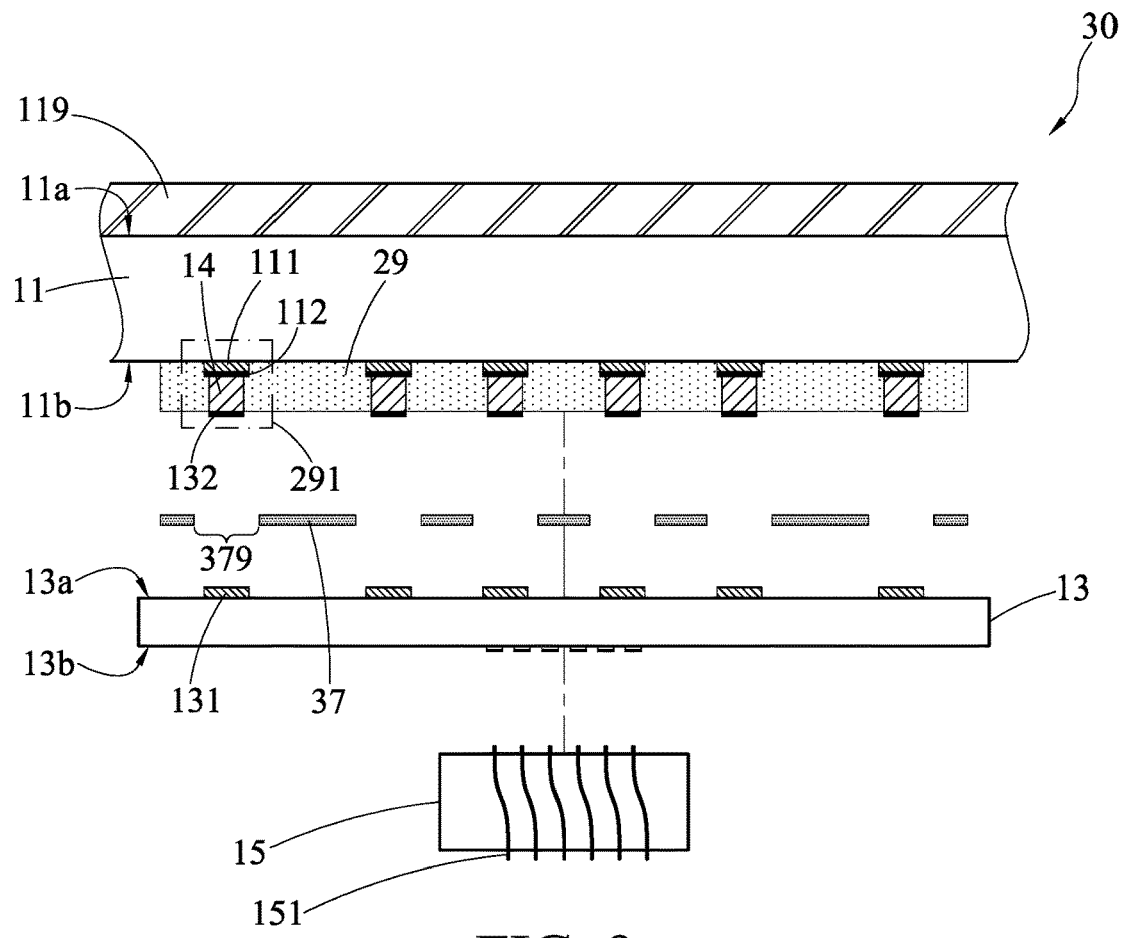
FIG. 9 is a schematic diagram (1) of a third embodiment according to the disclosure.
Figure 10:
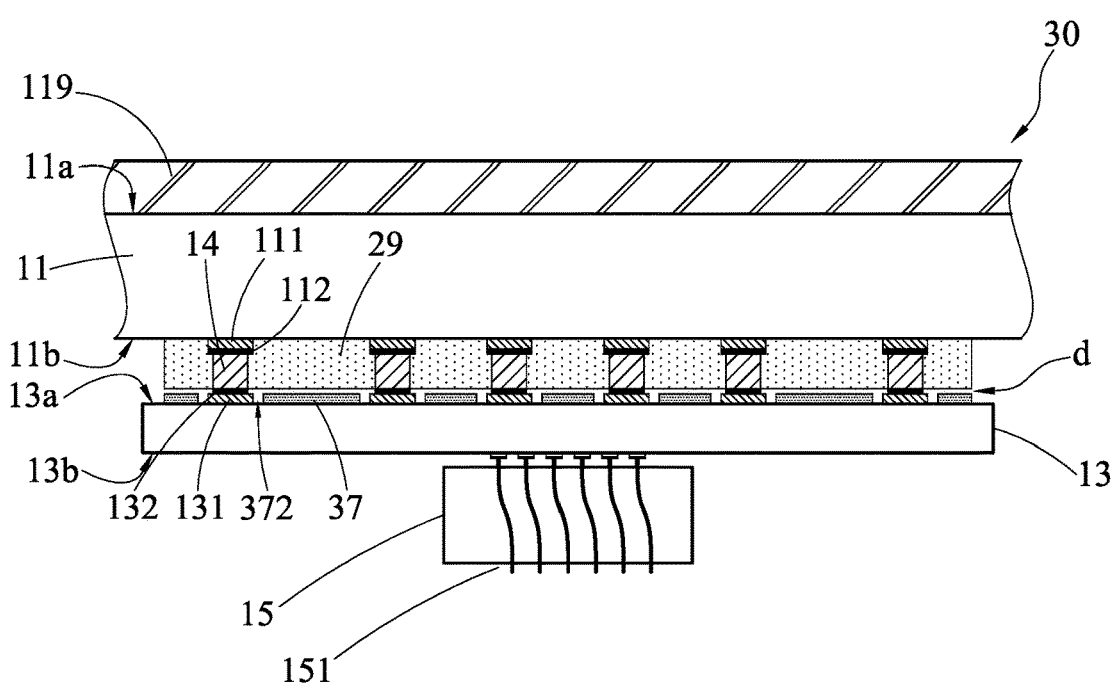
FIG. 10 is a schematic diagram (2) of a third embodiment according to the disclosure.

FIG. 9 and FIG. 10 are respectively a schematic diagram (1) and a schematic diagram (2) of a third embodiment according to the disclosure, where a probe card 30 is depicted. A main difference between this embodiment and the second embodiment is that a solder mask layer 37 is further formed on the top surface 13a of the space transformer 13. The solder mask layer 37 includes a plurality of openings 379 corresponding to the second contacts 131. A size of each opening 379 is larger than that of the second contact 131, thereby exposing each second contact 131 and forming a first groove 372 between the solder mask layer 37 and each second contact point 131. In this embodiment, the solder mask layer 37 partially occupies the gap d between the end face of the strengthening structure unit 291 (or a surface of the strengthening structure layer 29) and the top surface 13a of the space transformer 13. Therefore, during the wafer testing, the end face of the strengthening structure unit 191 (or the surface of the strengthening structure layer 29) is restricted by the solder mask layer 37 to further improve a flex resistance of the space transformer 13.

In the third embodiment, the strengthening structure unit 291 (or the strengthening structure layer 29) may also be not in contact with the side surface of the copper pillar 14, but the exhaust slot 182 is formed around each copper pillar 14, as shown in FIG. 2. In addition, the solder mask layer 37 in the third embodiment can also be replaced by a photoresist layer.

Figure 11:
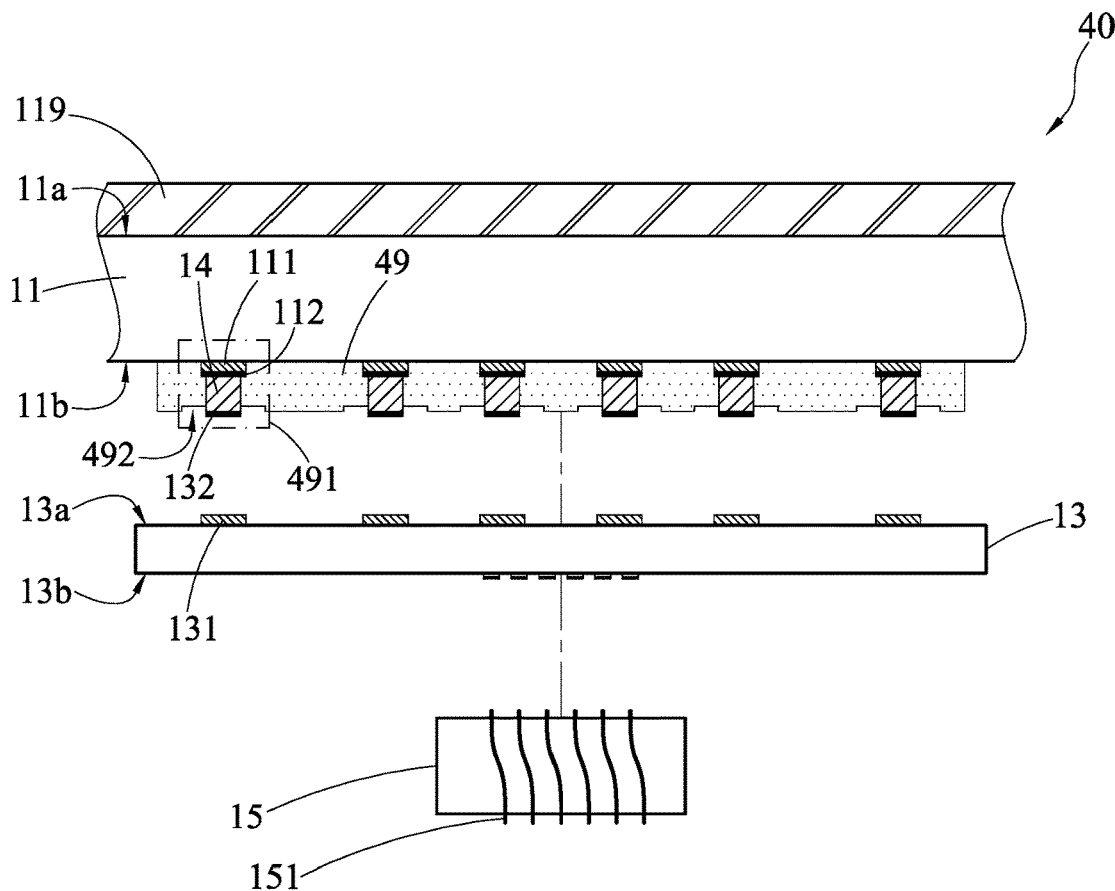
FIG. 11 is a schematic diagram (1) of a fourth embodiment according to the disclosure.
Figure 12:
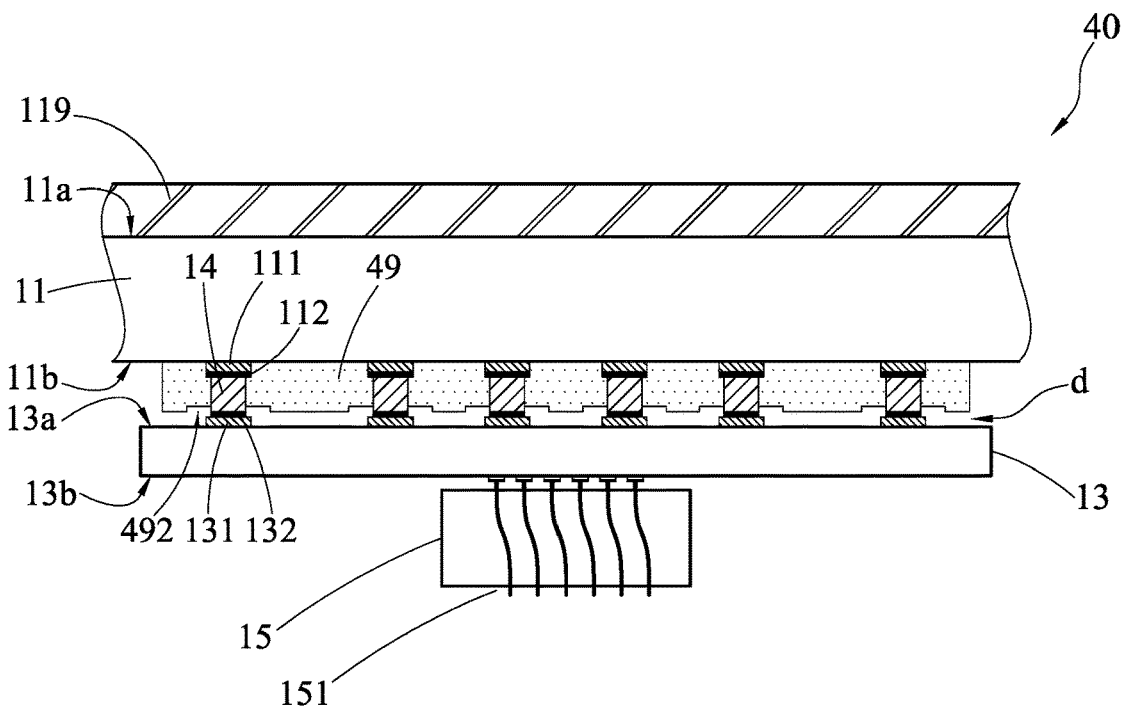
FIG. 12 is a schematic diagram (2) of a fourth embodiment according to the disclosure.

FIG. 11 and FIG. 12 are respectively a schematic diagram (1) and a schematic diagram (2) of a fourth embodiment according to the disclosure, where a probe card 40 is depicted. A main difference between this embodiment and the second embodiment is that a second groove 492 is formed on the surface of each strengthening structure unit 491 facing the space transformer 13. Each second groove 492 surrounds the copper pillar 14, and the side surface of the copper pillar 14 is partially exposed in the second groove 492. A function of the second groove 492 is to allow the gas generated by the first solder 112 and the second solder 132 during the reflow soldering process to more easily overflow to the outside.

In the fourth embodiment, the strengthening structure unit 491 (or the strengthening structure layer 49) may also be not in contact with the side surface of the copper pillar 14, but the exhaust slot 182 is formed around each copper pillar 14, as shown in FIG. 2. In addition, the solder mask layer 37 (or the photoresist layer) in the third embodiment can also be applied to the fourth embodiment.

Figure 13:
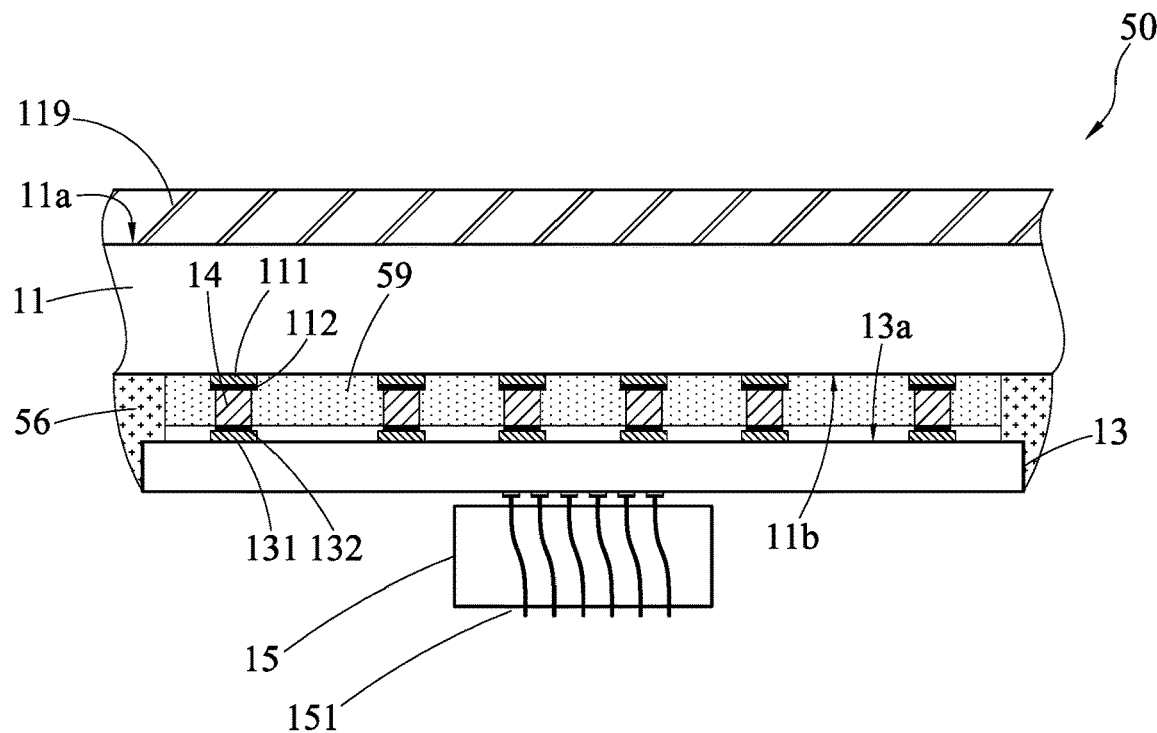
FIG. 13 is a schematic diagram of a fifth embodiment according to the disclosure.

FIG. 13 is a schematic diagram of a fifth embodiment according to the disclosure, where a probe card 50 is depicted. The strengthening structure units in this embodiment are connected to each other to form a strengthening structure layer 59. A main difference between this embodiment and the second embodiment is that a side glue 56 is further included. The side glue 56 is coated on the bottom surface 11b of the printed circuit board 11 along a periphery of the space transformer 13 and further covers the side surface of the space transformer 13. In some embodiments, the side glue 56 does not need to completely cover the periphery of the space transformer 13, that is, a space between the bottom surface 11b of the printed circuit board 11 and the top surface 13a of the space transformer 13 is allowed to communicate with the outside. Due to a high flexibility of the space transformer 13, the periphery of the space transformer 13 is fixed to the printed circuit board 11 with a high rigidity by using the side glue 56, which can further improve a capability of the space transformer 13 to resist deformation.

Figure 14:
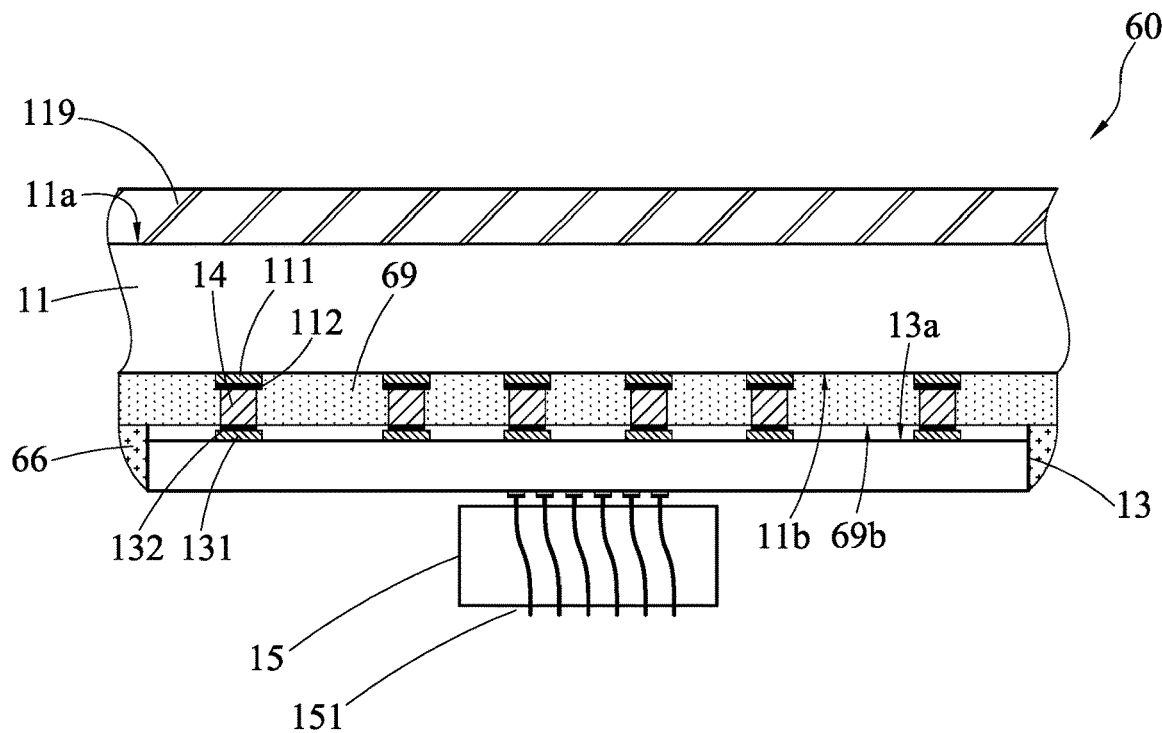
FIG. 14 is a schematic diagram of a sixth embodiment according to the disclosure.

FIG. 14 is a schematic diagram of a sixth embodiment according to the disclosure, where a probe card 60 is depicted. The strengthening structure units in this embodiment are connected to each other to form a strengthening structure layer 69. A main difference between this embodiment and the fifth embodiment is that the side glue 66 is coated on the bottom surface 69b of the strengthening structure layer 69 along the periphery of the space transformer 13 and further covers the side surface of the space transformer 13. In some embodiments, the side glue 66 does not need to completely coat the periphery of the space transformer 13, that is, one or more openings may be remained to allow a space between the bottom surface 69b of the strengthening structure layer 69 and the top surface 13a of the space transformer 13 to communicate with the outside. Similarly, due to the high flexibility of the space transformer 13, the periphery of the space transformer 13 is fixed to the strengthening structure layer 69 with a high rigidity by using the side glue 66, which can further improve a capability of the space transformer 13 to resist deformation.

In summary, according to the disclosure, the deformation amount of the space transformer 13 can be greatly reduced during the wafer testing process by arranging the strengthening structure unit around the copper pillar between the printed circuit board 11 and the space transformer 13, thereby avoiding the problem of fatigue failure or fracture of contacts between the space transformer and the probe card. In addition, some embodiments of the disclosure further include the following features: (1) High reliability of reworking. Because the space transformer and the bonding pad on the printed circuit board are electrically connected to the copper pillar by using a solder, when reworking is required for desoldering, the copper pillar and the space transformer are separated, to avoid destroying the bonding pad on the printed circuit board. Under the architecture of the prior art, in a desoldering process, the space transformer or the bonding pad on the printed circuit board may be damaged. (2) The strengthening structure unit is arranged on the printed circuit board. Because the rigidity of the printed circuit board is greater than that of the space transformer, a metal reinforcing member may be further arranged on the printed circuit board to further improve an overall rigidity, and a support effect of arranging the strengthening structure unit on the printed circuit board is better than that of arranging the strengthening structure unit on the space transformer. (3) Good flatness. Due to material and process problems of the PCB, the flatness of the PCB is poor, and the flatness of a flat surface (flatness<50 um) defined by the strengthening structure and the copper pillar is less than that of the PCB, so that the flatness of the space transformer and the probe is synchronously improved.

Although the disclosure has been described in considerable detail with reference to certain preferred embodiments thereof, the disclosure is not for limiting the scope of the invention. Persons having ordinary skill in the art may make various modifications and changes without departing from the scope and spirit of the disclosure. Therefore, the scope of the appended claims should not be limited to the description of the preferred embodiments described above.

What is claimed is:

1. A wafer testing assembly, comprising:
   a printed circuit board, comprising a bottom surface and a plurality of first contacts, wherein the first contacts are arranged on the bottom surface;
   a space transformer, comprising a top surface and a plurality of second contacts, wherein the second contacts are arranged on the top surface and corresponding to the first contacts;
   a plurality of copper pillars, respectively arranged between the corresponding first contacts and second contacts, wherein each of the copper pillars is electrically connected to the first contact with an end and electrically connected to the second contact with an other end; and
   a plurality of strengthening structure units, formed on the bottom surface of the printed circuit board and respectively surrounding the copper pillars;
   wherein the other end of each of the copper pillars is electrically connected to the second contact by using a solder, and there is a gap between end faces of the strengthening structure units and the top surface of the space transformer.

2. The wafer testing assembly according to claim 1, wherein end faces of the copper pillars facing the top surface of the space transformer are coplanar with end faces of the strengthening structure units.

3. The wafer testing assembly according to claim 1, further comprising:
   a plurality of first solders, respectively formed on the first contacts, wherein the end of each of the copper pillars is electrically connected to the first contact by using the first solder; and
   a plurality of second solders, respectively formed on the other end of each of the copper pillars, wherein two ends of each of the copper pillars are respectively electrically connected to the first contact and the second contact by using the first solder and the second solder.

4. The wafer testing assembly according to claim 1, wherein the gap is less than or equal to 20 microns.

5. The wafer testing assembly according to claim 4, wherein the gap is less than or equal to 15 microns.

6. The wafer testing assembly according to claim 1, wherein the strengthening structure units are not in contact with side surfaces of the copper pillars.

7. The wafer testing assembly according to claim 6, further comprising a solder mask layer formed on the top surface of the space transformer, wherein the solder mask layer comprises a plurality of openings corresponding to the second contacts, and a size of each of the openings is larger than that of the second contact, so that a first groove is formed between each of the second contacts and the solder mask layer.

8. The wafer testing assembly according to claim 6, further comprising a photoresist layer formed on the top surface of the space transformer, wherein the photoresist layer comprises a plurality of openings corresponding to the second contact, and a size of each of the openings is larger than that of the second contact, so that a first groove is formed between each of the second contacts and the photoresist layer.

9. The wafer testing assembly according to claim 6, wherein a surface of each of the strengthening structure units facing the space transformer comprises a second groove, the second groove surrounds the copper pillar, and a side surface of the copper pillar is partially exposed in the second groove.

10. The wafer testing assembly according to claim 1, wherein the strengthening structure units are in contact with side surfaces of the copper pillars.

11. The wafer testing assembly according to claim 10, further comprising a solder mask layer formed on the top surface of the space transformer, wherein the solder mask layer comprises a plurality of openings corresponding to the second contacts, and a size of each of the openings is larger than that of the second contact, so that a first groove is formed between each of the second contacts and the solder mask layer.

12. The wafer testing assembly according to claim 10, further comprising a photoresist layer formed on the top surface of the space transformer, wherein the photoresist layer comprises a plurality of openings corresponding to the second contacts, and a size of each of the openings is larger than that of the second contact, so that a first groove is formed between each of the second contacts and the photoresist layer.

13. The wafer testing assembly according to claim 10, wherein a surface of each of the strengthening structure units facing the space transformer comprises a second groove, the second groove surrounds the copper pillar, and a side surface of the copper pillar is partially exposed in the second groove.

14. The wafer testing assembly according to claim 1, further comprising a side glue coated on the bottom surface of the printed circuit board along a periphery of the space transformer and covering a side surface of the space transformer.

15. The wafer testing assembly according to claim 1, further comprising a side glue, wherein the strengthening structure units are connected to each other to form a strengthening structure layer, and the side glue is arranged on the strengthening structure layer along a periphery of the space transformer and covering a side surface of the space transformer.

16. The wafer testing assembly according to claim 1, wherein the strengthening structure units are connected to each other to form a strengthening structure layer.

17. The wafer testing assembly according to claim 16, wherein end faces of the copper pillars facing the top surface of the space transformer are coplanar with surfaces of the strengthening structure layers.

18. The wafer testing assembly according to claim 1, wherein there is a gap between end faces of the strengthening structure units and the top surface of the space transformer.

19. A probe card, comprising:
a wafer testing assembly comprising:
a printed circuit board, comprising a bottom surface and a plurality of first contacts, wherein the first contacts are arranged on the bottom surface;
a space transformer, comprising a top surface and a plurality of second contacts, wherein the second contacts are arranged on the top surface and corresponding to the first contacts;
a plurality of copper pillars, respectively arranged between the corresponding first contacts and second contacts, wherein two ends of each of the copper pillars are respectively electrically connected to the first contact and the second contact; and
a plurality of strengthening structure units, arranged on the bottom surface of the printed circuit board and respectively surrounding the copper pillars;
a metal reinforcing member, arranged on the top surface of the printed circuit board; and
a probe head, arranged on the bottom surface of the space transformer.

\* \* \* \* \*